United States Patent
Huang et al.

(10) Patent No.: US 7,227,588 B2
(45) Date of Patent: Jun. 5, 2007

(54) CLAMPING SYSTEM FOR CLAMPING A VIDEO SIGNAL BY USING A CHARGE-PUMP CIRCUIT

(75) Inventors: Yuan-Hao Huang, Hsinchu (TW); Hsien-Chih She, Hsinchu (TW); Chun-Cheng Huang, Hsinchu (TW); Shang-Yi Lin, Hsinchu (TW); Jen-Shi Wu, Hsinchu (TW)

(73) Assignee: VXIS Technology Corp, Hsinchu (TW)

( * ) Notice: Subject to any disclaimer, the term of this patent is extended or adjusted under 35 U.S.C. 154(b) by 471 days.

(21) Appl. No.: 10/919,560

(22) Filed: Aug. 17, 2004

(65) Prior Publication Data

US 2005/0128359 A1   Jun. 16, 2005

(30) Foreign Application Priority Data

Dec. 11, 2003 (TW) .............................. 092134998 A (51) Int. Cl.
*H04N 5/16* (2006.01)
*H04N 5/18* (2006.01)

(52) U.S. Cl. ........................................ 348/691; 348/572

(58) Field of Classification Search ................ 348/691, 348/692, 572, 573, 689, 695, 536; 327/148, 327/157; 331/1 A, 20, 25; *H04N 5/16, 5/18*
See application file for complete search history.

(56) References Cited

U.S. PATENT DOCUMENTS

| 6,011,822 | A  | * | 1/2000  | Dreyer         | 327/157 |
| 6,177,843 | B1 | * | 1/2001  | Chou et al.    | 331/25  |
| 6,323,910 | B1 | * | 11/2001 | Clark, III     | 348/572 |

* cited by examiner

*Primary Examiner*—Sherrie Hsia
(74) *Attorney, Agent, or Firm*—Alan Kamrath; Kamrath & Associates (57) ABSTRACT

A clamping system for clamping a video signal, wherein the clamping system uses a charge-pump unit in company with a digital clamping controller to clamp the potential of the video signal, prior to the video signal being input to a programmable gain amplifier and an A/D converter, so as to reach a desired level. The charge-pump unit provides two charge-pump circuits, wherein one charge-pump circuit supplies a strong burst to boost the potential of the video signal while the video signal is below a threshold value. Otherwise, the other charge-pump circuit supplies a weak burst to fine tune the potential of the video signal when the video signal has reached the threshold value.

7 Claims, 7 Drawing Sheets

CLAMPING SYSTEM FOR CLAMPING A VIDEO SIGNAL BY USING A CHARGE-PUMP CIRCUIT

BACKGROUND OF THE INVENTION

1. Field of the Invention

The present invention relates to a clamping system for clamping a video signal, more particularly, to a clamping system that uses a charge-pump unit in association with a digital control mode to clamp the voltage level of the video signal, prior to the video signal being input to a programmable gain amplifier and an A/D converter, so as to reach a desired level.

2. Description of Related Art

When converting an analog video signal to a digital signal, the analog video signal is clamped to a desired level before being input to a programmable gain amplifier (PGA) and an analog/digital converter, because the analog video signal is usually far away from the required threshold level of the PGA and A/D converter. For example, such clamping technique is disclosed in U.S. Pat. No. 5,995,166 issued to Mitsubishi Denki Kabushiki Kaisha and U.S. Pat. No. 6,008,864 issued to Sony Corporation and Sony Electronics, Inc.

Figure 8:
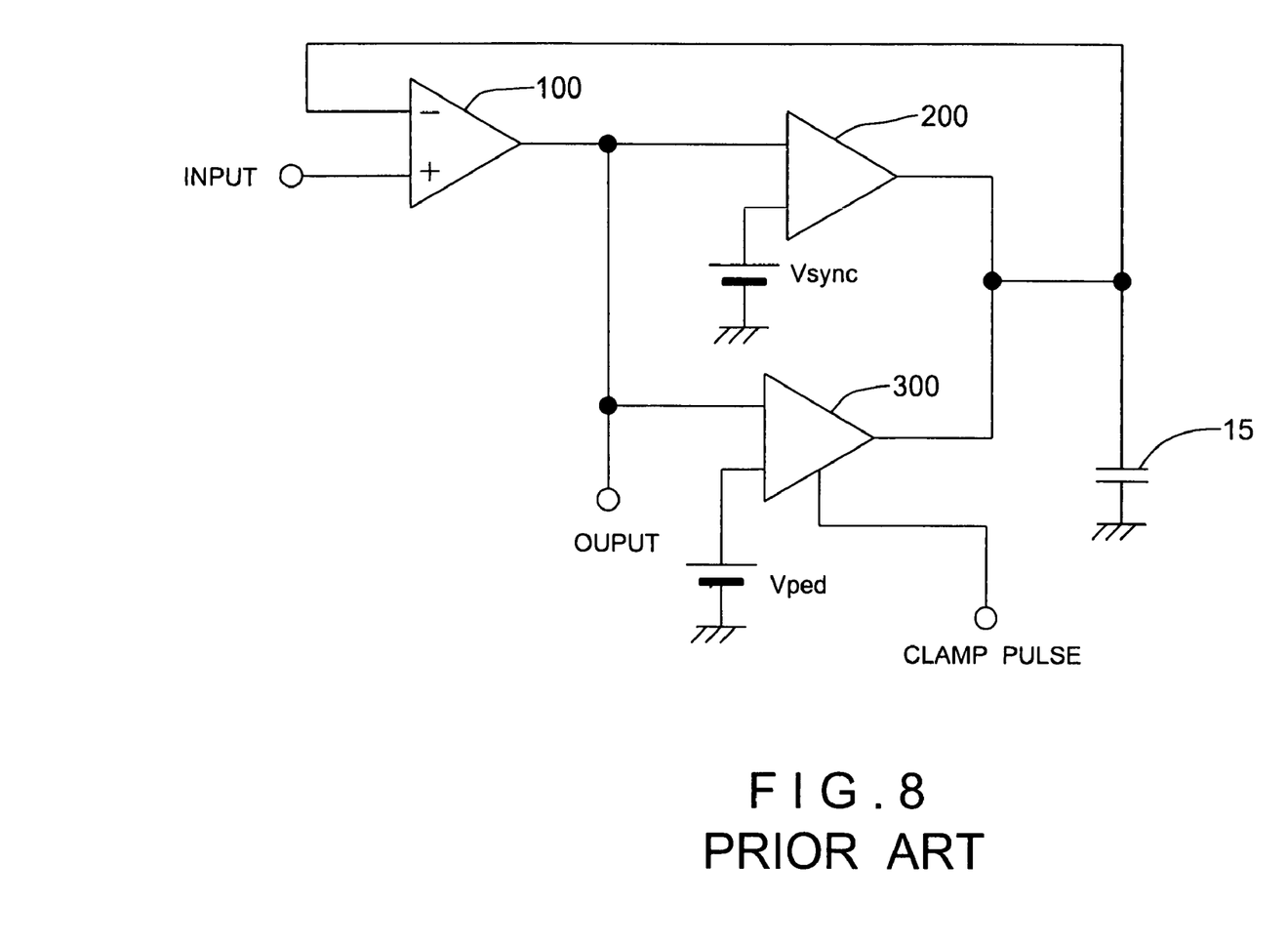
FIG. 8 is a circuit diagram of a conventional clamping circuit.

With reference to FIG. 8, which is a preferred embodiment of a clamping circuit taught by U.S. Pat. No. 5,995,166, the clamping circuit comprises a direct current electrical potential correcting circuit (100), a first processing circuit (200) and a second processing circuit (300). The DC electrical potential correcting circuit (100) has a non-inverted input terminal into which an analog video signal is input, an inverted input terminal connected to a capacitor (15) with a sample hold electrical potential, and an output terminal connected to the first processing circuit (200) and the second processing circuit (300).

Either of the first processing circuit (200) and the second processing circuit (300) has a first input node, a second input node and an output node. Their first input nodes are connected to the output terminal of the DC electrical potential correcting circuit (100). Their second input nodes are individually connected to a respective reference voltage Vsync and Vped, wherein both the Vsync and Vped are set based on the DC electrical potential in the composite video signal. The output nodes of the two processing circuits (200 and 300) are connected to the capacitor (15) with the sample hold electrical potential. The second processing circuit (200) is activated by receiving a clamp pulse input into a clamp pulse input node, whereby the capacitor (15) is alternately charged or discharged.

Based on the direct current electrical potential of the capacitor (15), the DC electrical potential correcting circuit (100) clamps the direct current electrical potential of the analog composite video signal.

Although the clamping circuit is able to clamp the direct current electrical potential of the analog composite video signal, the circuit does not consider the variation of the analog composite video signal so that the control flexibility is quite poor.

SUMMARY OF THE INVENTION

The objective of the present invention is to provide a clamping system for clamping a video signal, wherein based on whether a sync tips signal of the video signal is detected, the clamping system supplies either a strong burst or a weak burst to clamp the video signal.

To achieve the objective, the clamping system comprises:
a charge-pump unit, which receives and clamps a potential of an analog video signal, wherein the charge-pump unit is composed of a first and a second charge-pump circuit;
a programmable gain amplifier (PGA) coupled to the charge-pump unit to amplify the clamped analog video signal;
an analog to digital converter coupled to the PGA to convert the amplified analog video signal to a digital video signal; and
a digital clamping controller coupled to the A/D converter, wherein the digital clamping controller detects whether a sync tips signal is contained in the digital video signal output from the A/D converter, and based on the detected result to control the charge-pump unit to clamp the analog video signal by using a strong burst signal or a weak burst signal.

Other objects, advantages, and unique features of the invention will become more apparent from the following detailed description and accompanying drawings.

DETAILED DESCRIPTION OF THE PREFERRED EMBODIMENT

Figure 1:
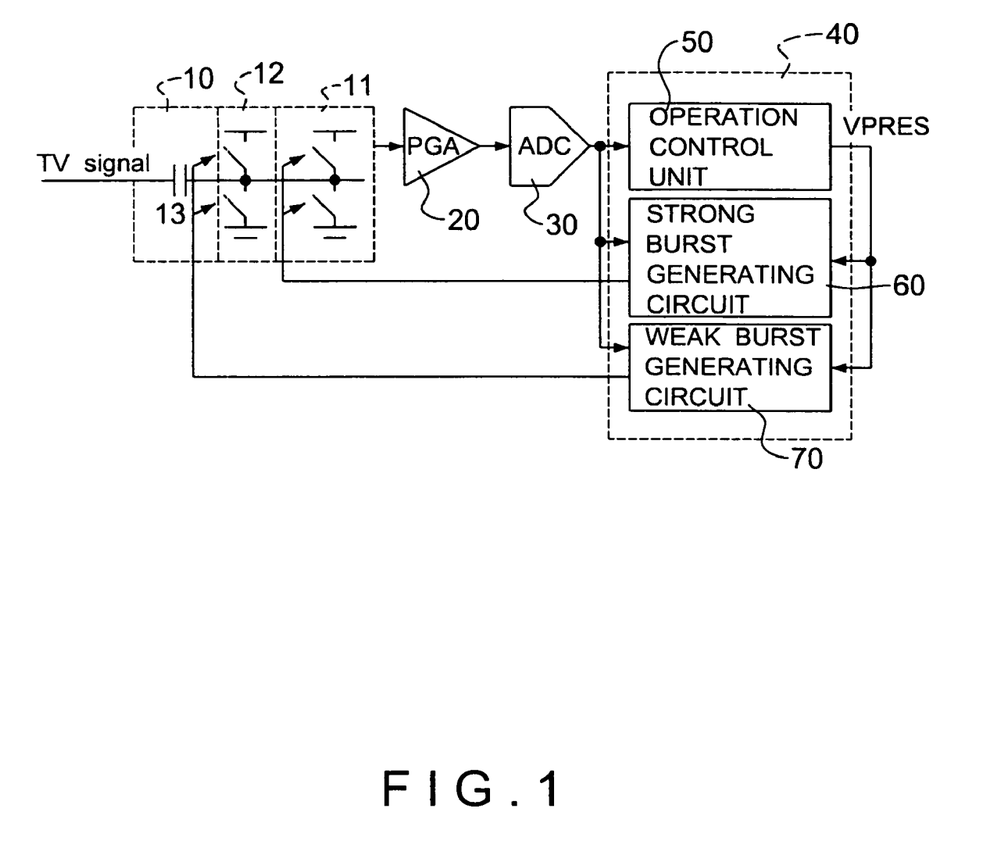
FIG. 1 is a block diagram of a clamping system in accordance with the present invention.

With reference to FIG. 1, a clamping system of the present invention comprises a charge-pump unit (10) that clamps a potential of an analog TV signal, a PGA (20) for amplifying the clamped signal, an A/D converter (30) that converts the amplified TV signal to a digital signal, and a digital clamping controller (40) applied to control charge/discharge operations of the charge-pump unit (10).

The clamping system has two operation modes; a strong clamping mode and a weak clamping model.

The strong clamping mode means that the potential of the analog TV signal is significantly higher or lower than a predetermined clamping range and the digital clamping controller (40) is unable to detect the existence of the digital signal.

Contrary to the foregoing strong clamping mode, the weak clamping mode means that the potential of the analog TV signal has reached the predetermined clamping range and the digital clamping controller (40) has detected the existence of the digital signal.

Figure 2:
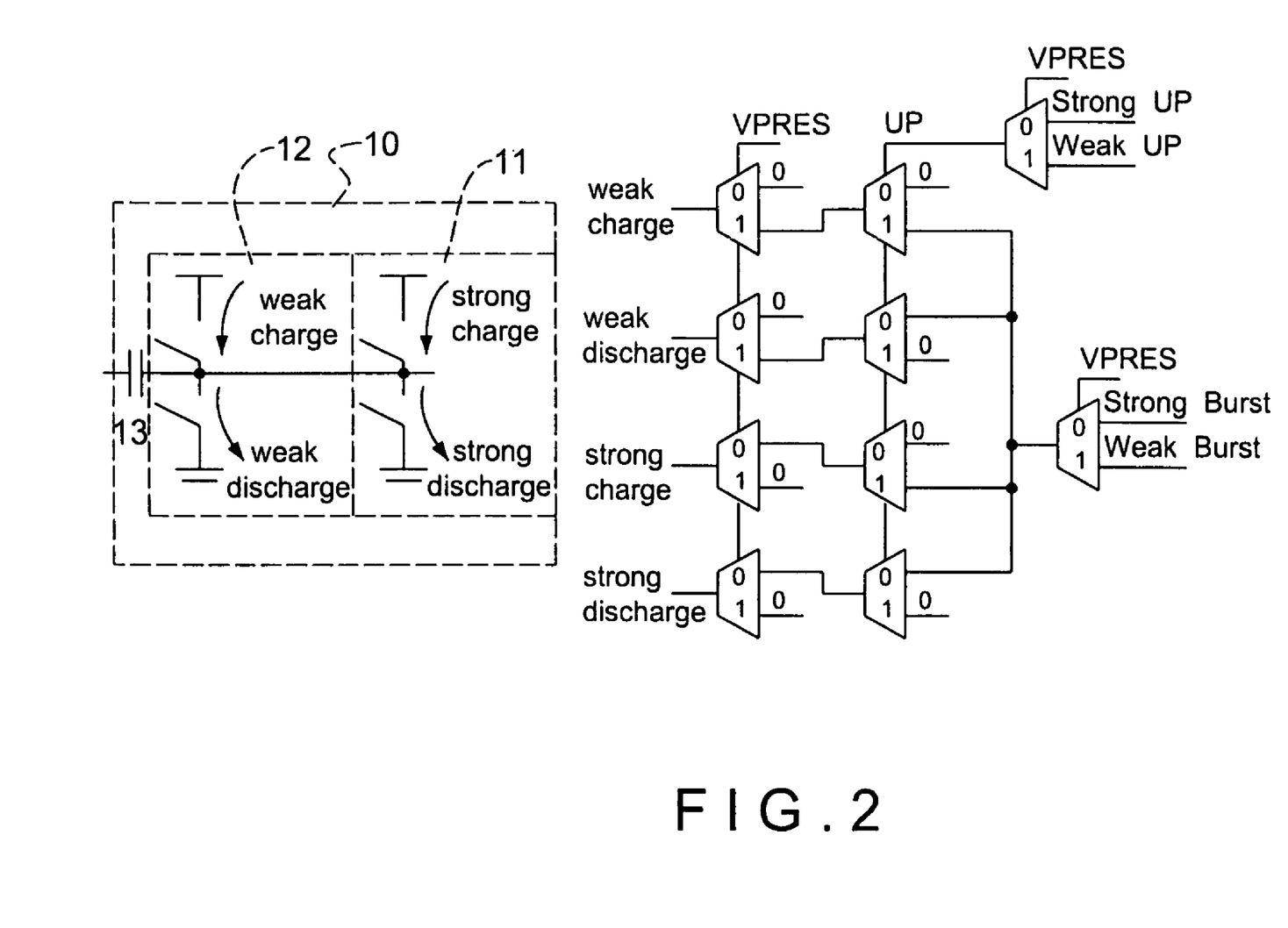
FIG. 2 is a circuit operation diagram of a charge-pump unit in accordance with the present invention.

Based on either the strong clamping mode or the weak clamping mode, the digital clamping controller (40) controls the charge-pump unit (10) to output a weak burst or a strong burst, respectively. The charge-pump unit (10) comprises two charge-pump circuits (11)(12). With reference to FIG. 2, the first charge-pump circuit (11) is composed of a strong charge switch and a strong discharge switch selectively coupled in series between an operating voltage and ground. The second charge-pump circuit (12) is composed of a weak charge switch and a weak discharge switch selectively coupled in series between the operating voltage and ground. Each switch is controlled to be conducting/non-conducting by the strong burst or weak burst output from the digital clamping controller (40).

When an output flag VPRES of the digital clamping controller (40) is a high potential (VPRES=1), that means the TV signal is detected so that the clamping system enters the weak clamping model. The potential of the detected TV signal is further compared with a predetermined threshold value. In a case that the potential of the detected TV signal is slightly higher than the predetermined threshold value, the weak discharge switch of the second charge-pump circuit (12) is conducted to finely reduce the potential. Otherwise, if the potential of the detected TV signal is slightly lower than the predetermined threshold value, the weak charge switch of the second charge-pump circuit (12) is conducted to increase the potential.

In another hand, when the output flag VPRES of the digital clamping controller (40) is a low potential (VPRES=0), that means the TV signal is not within the predetermined clamping range, i.e. the TV signal is higher or lower the predetermined clamping range. Therefore the clamping system enters the strong clamping model to perform a charge or a discharge operation. Further, in a case that the potential of the TV signal is lower than an offset value, the strong charge switch of the first charge-pump circuit (11) is conducted. Otherwise, if the TV signal is significantly lower than the offset value, the strong discharge switch of the first charge-pump circuit (11) is conducted.

With reference to FIG. 1 again, the digital clamping controller (40) comprises an operation control unit (50), a strong burst generating circuit (60) and a weak burst generating circuit (60).

The operation control unit (50) couples to the output terminal of the A/D converter (30) to detect whether the TV signal has the component of sync tips.

The strong burst generating circuit (60) has input terminals connected to the output terminals of the operation control unit (50) and the A/D converter (30). Based on the two input signals, the strong burst generating circuit (60) can continuously output strong bursts with constant duration and a strong up signal to control the charge-pump unit (10).

The weak burst generating circuit (70) has input terminals connected to the output terminals of the operation control unit (50) and the A/D converter (30). Based on the two input signals, the weak burst generating circuit (70) can output a weak burst with a proper duration to control the charge-pump unit (10).

Figure 3:
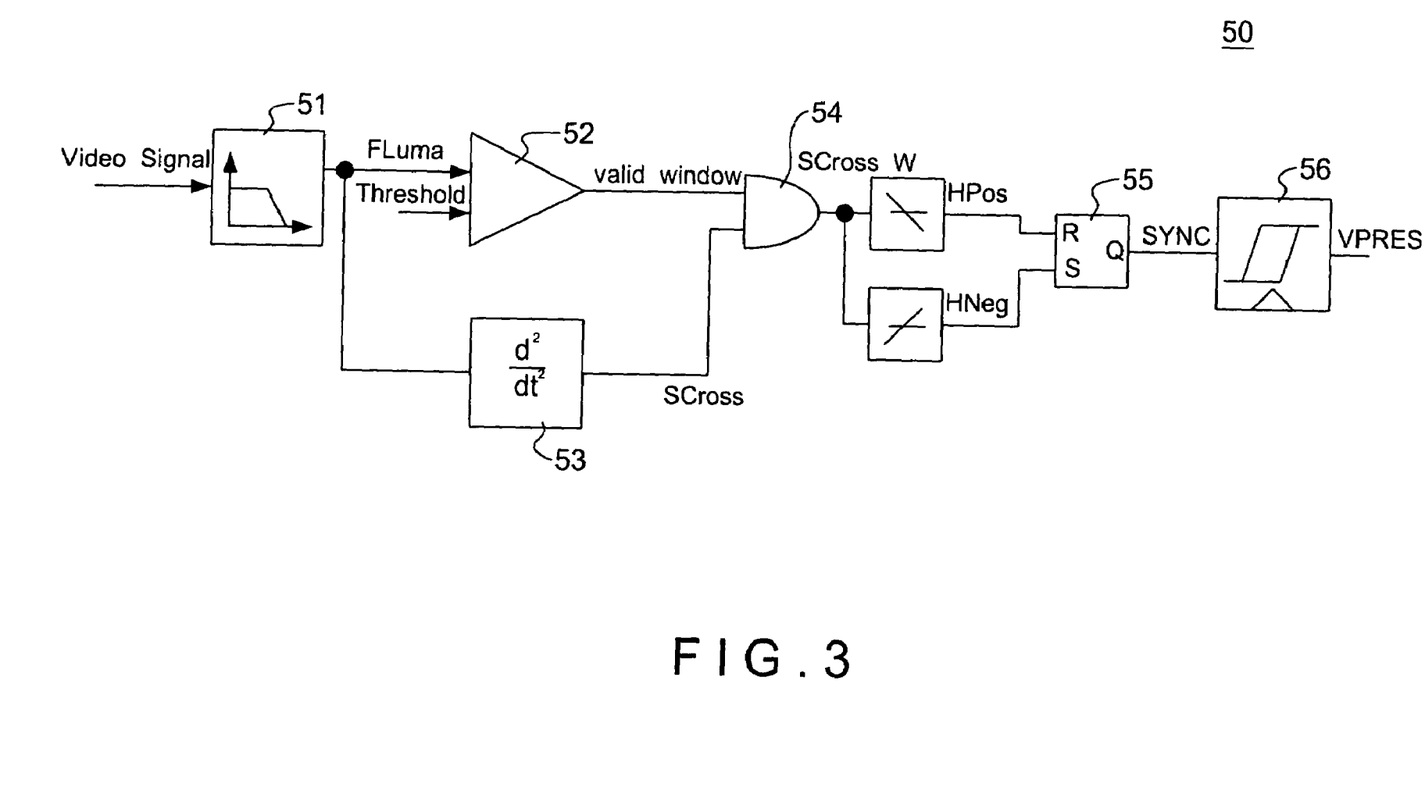
FIG. 3 is a circuit diagram of an operation control unit of the present invention.
Figure 4:
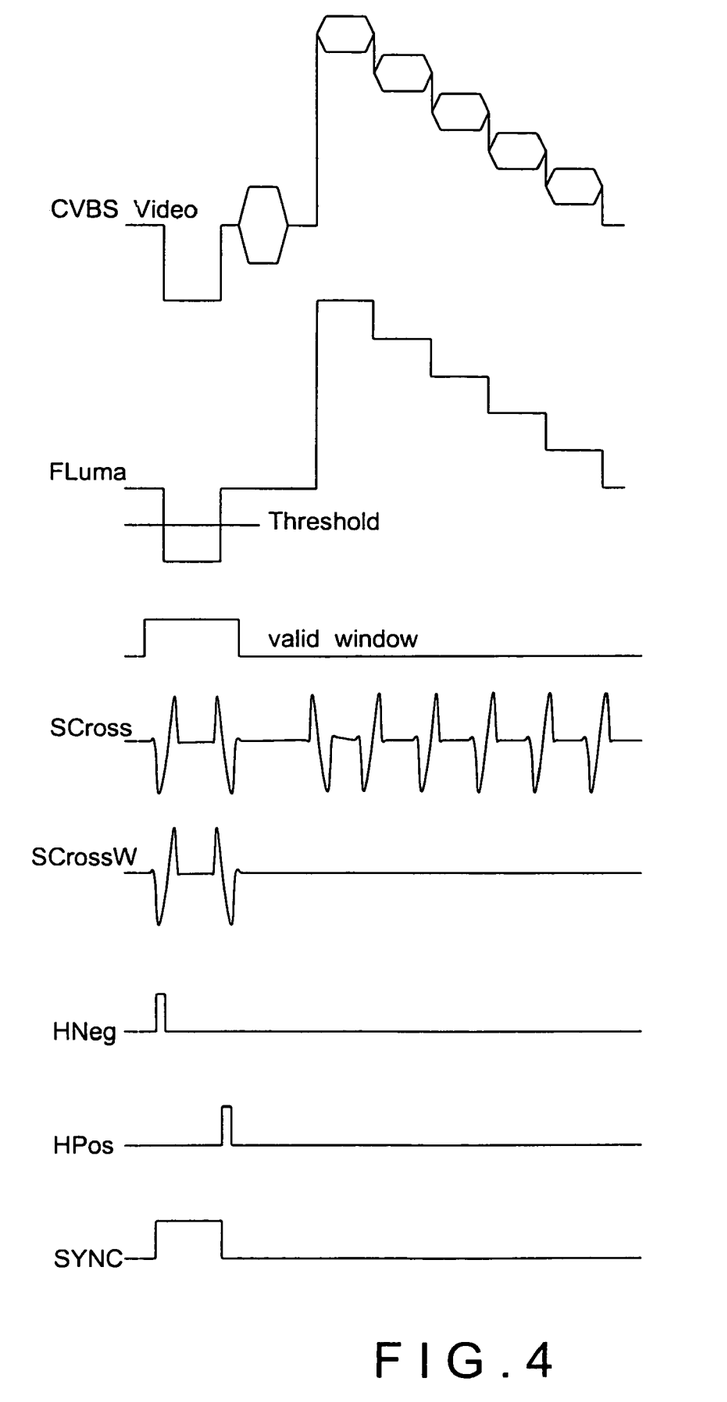
FIG. 4 illustrates exemplary waveforms of the operation control unit of the present invention.

With reference to FIGS. 3 and 4, the operation control unit (50) comprises a low-pass filter (51), a comparator (52), a quadratic differential circuit (53), an AND gate (54), an R-S flip flop (55) and a retarding counter (56). Chroma components and high frequency noises contained in the video signal are filtered out by the low-pass filter (51). The filtered video signal is then compared with the predetermined threshold value by the comparator (52) to detect the sync tips of the video signal. Meanwhile, the filtered video signal output from the low-pass filter (51) is also input to the quadratic differential circuit (53), whereby a negative edge (HNeg) of the sync tips and a positive edge (HPos) of the sync tips are detected. The output signals of the comparator (52) and the quadratic differential circuit (53) are further input to the AND gate (54). In the situation that both the negative edge (HNeg) and the positive edge (HPos) are successfully detected, a horizontal sync signal is deemed as being detected. The output signal of the AND gate (54) is input to the retarding counter (56) through the R-S flip flop (55). The potential of the output signal VPRES of the retarding counter (56) is used as a basis for determine clamping models, as mentioned above.

Figure 5:
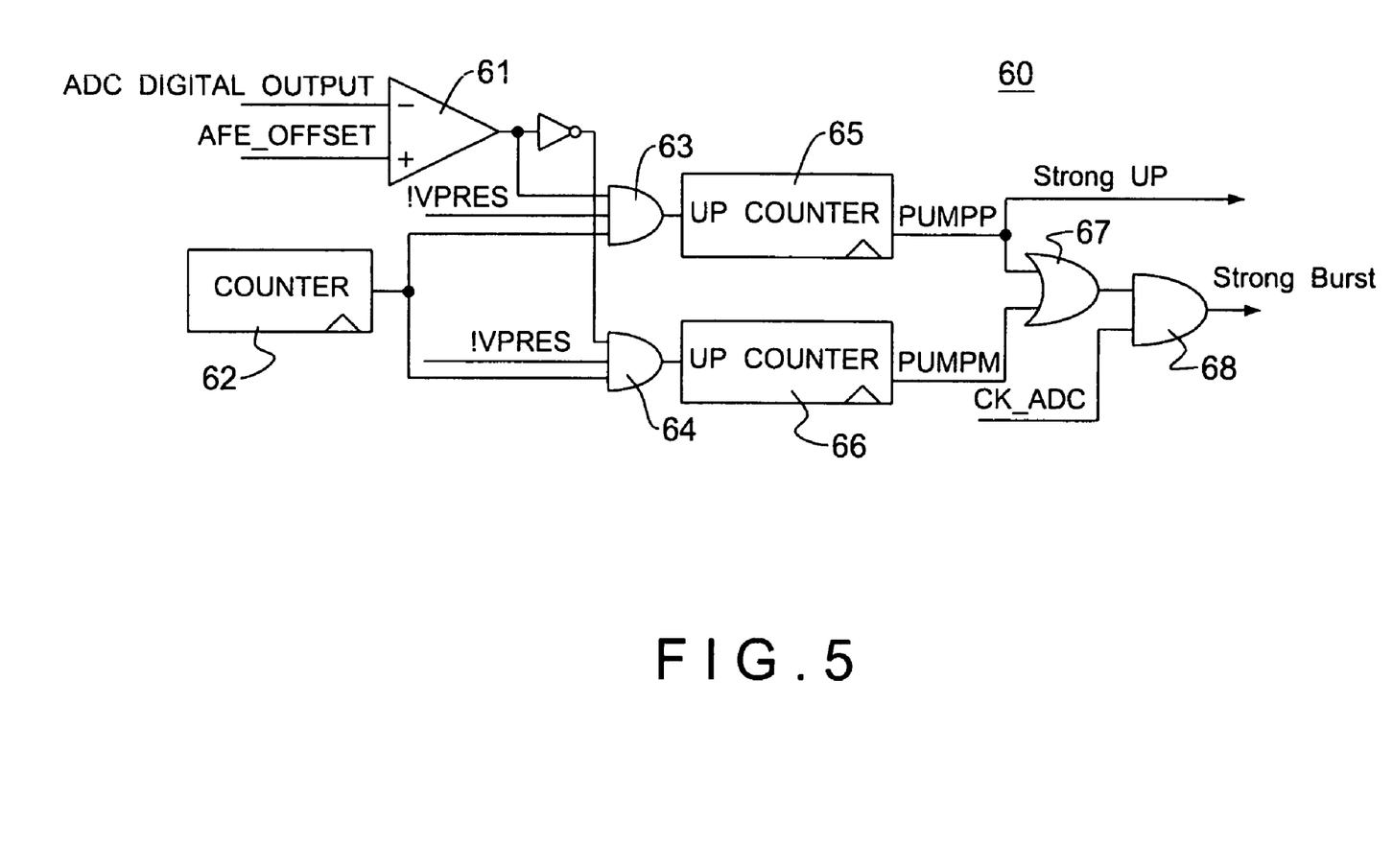
FIG. 5 is a circuit diagram of a strong burst generating circuit of the present invention.

With reference to FIG. 5, the strong clamping mode (i.e. VPRES=0) is explained hereinafter. The burst generating circuit (60) has a comparator (61), a counter (62), two AND gates (63)(64), two up counters (65, 66), an OR gate (67) and another AND gate (68).

The comparator (61) utilizes an offset signal (AFE_OFFSET) with an adjustable constant level to be compared with the output signal of the A/D converter (60). The counter (62) is applied to generate sampling time intervals, wherein a 12-bit counter capable of generating 4096 sampling time intervals is used as an example hereinafter.

The output signal of the comparator (61) and an inverted output signal (!VPRES) of the operation control unit (50) are input to the first AND gate (63) to be performed with an AND logic operation at each sampling time interval. Alternatively, the second AND gate (64) executes an AND logic operation of an inverted output signal of the comparator (61) and an inverted output signal (!VPRES) of the operation control unit (50), at each sampling time interval.

The first up counter (65) is connected to the output terminal of the first AND gate (63) to accumulate the logic operation results, wherein the output signal of the first up counter (65) is used as a strong up signal. Similarly, the second up counter (66) is connected to the output terminal of the second AND gate (63) to accumulate the logic operation results.

The OR gate (67) has two input terminals respectively connected to the output terminals of the two up counters (65) and has an output terminal connected to the AND gate (68). Based on the output signal of the OR gate (67) and a clock signal of the A/D converter (CK_ADC), the AND gate (68) generates the strong burst signal.

After every sample interval, if the output signal of the operation control unit (50) is lower than the signal AFE_OFFSET in potential, the first up counter (65) accumulates its output data by adding one so as to generate the strong up signal as well as strong burst to control the first charge-pump circuit (1). As shown in FIG. 2, since VPRES=0 and strong burst as well as strong up signals are both input to the multiplexer, a strong charge signal is output to control the switch of the first charge-pump circuit (11).

Otherwise, if the output signal of the operation control unit (50) is higher than the signal AFE_OFFSET in potential, the first up counter (65) is disabled and only the second up counter (66) accumulates its output data by adding one so as to generate a strong burst signal to control the first charge-pump circuit (11). However, there is no "strong up" signal output from the first up counter (65). As shown in FIG. 2, since VPRES=0 and only the strong burst is input to the multiplexer, a strong discharge signal is output to control the switch of the first charge-pump circuit (11).

Figure 6:
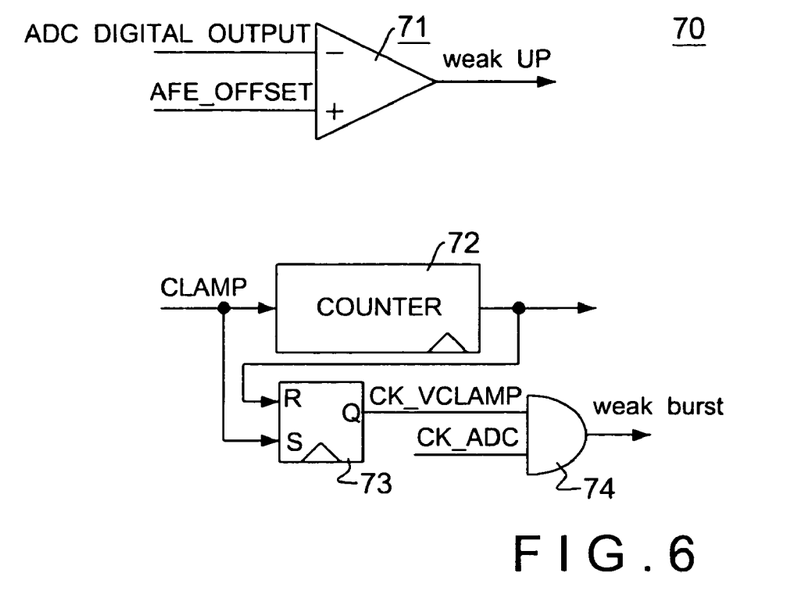
FIG. 6 is a circuit diagram of a weak burst generating circuit of the present invention.
Figure 7:
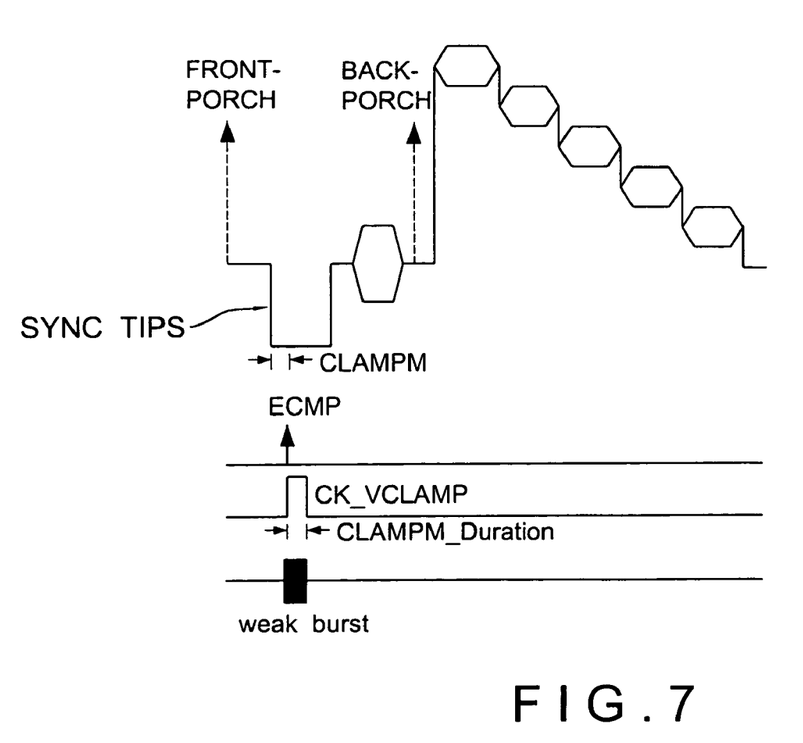
FIG. 7 illustrates exemplary waveforms of a weak burst generating circuit of the present invention.

With reference to FIGS. 6 and 7, the weak clamping mode (i.e. VPRES=1) is explained hereinafter. The weak burst generating circuit (70) is composed of a comparator (71), a counter (72), an R-S flip flop (73) and an AND gate (74).

The comparator (71) has an inverted input terminal and a non-inverted signal that respectively receives the output signal of the A/D converter (30) and the offset signal (AFE_OFFSET). Based on the two received signals, the comparator (71) outputs a weak up signal.

The counter (72) is provided to set the pulse width of the weak burst, i.e. to determine the weak charge duration.

The R-S flip flop (73) generates a trig signal (CK_VCLAMP) based on a clamp signal and the output signal of the counter (72).

The AND gate (73) receives the trig signal (CK_VCLAMP) and the clock signal (CK_ADC) of the A/D converter (30) to generate the weak burst signal.

Because the clamping system is operated in the weak clamping mode, that means the horizontal sync tips have been detected and its potential is approximate to the threshold value. If the potential of sync tips signal is higher than that of the offset signal (AFE_OFFSET), a weak discharge signal is output to control the corresponding switch in the second charge-pump circuit (10). Otherwise, if the potential of sync tips signal is lower than that of the offset signal (AFE_OFFSET), a weak charge signal is output to control the corresponding switch in the second charge-pump circuit (10), wherein the pulse width of the weak charge signal is determined by the counter (72).

As shown in FIG. 7, the phase of the weak burst signal is able to be shifted based on the negative edge of the sync tips signal. In more detail, when a control register is optionally adopted to adjust the time that the weak burst occurs, the weak burst signal could be generated prior to the sync tips signal, i.e. the front porch, or behind the sync tips signal, i.e. the back porch.

It is to be understood, however, that even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A clamping system for clamping a video signal, the clamping system comprising:
    a charge-pump unit (10), which receives and clamps a potential of an analog video signal, wherein the charge-pump unit (10) is composed of a first charge pump circuit (11) and a second charge-pump circuit (12);
    a programmable gain amplifier (PGA) (20) coupled to the charge-pump unit (10) to amplify the clamped analog video signal;
    an analog to digital converter (30) coupled to the PGA (20) to convert the amplified analog video signal to a digital video signal; and
    a digital clamping controller (40) coupled to the A/D converter (30), wherein the digital clamping controller (40) detects whether a sync tips signal is contained in the digital video signal output from the A/D converter (30), and based on the detected result to control the charge-pump unit (10) to clamp the analog video signal by using a strong burst signal or a weak burst signal.

2. The clamping system as claimed in claim 1, wherein the digital clamping, controller comprises:
    an operation control unit (50) coupled to an output terminal of the A/D converter (30) to detect whether the video signal has the sync tips;
    a strong burst generating circuit (60) connected to the operation control unit (50) and the A/D converter (30), wherein based on output signals of the operation control unit (50) and the A/D converter (30), the strong burst generating circuit (60) outputs a strong burst and a strong up signal to control the charge-pump unit (10) to perform a strong clamping mode if the sync tip is not detected; and
    a weak burst generating circuit (70) connected to the operation control unit (50) and the A/D converter (30), wherein the weak burst generating circuit (70) is able to output a weak burst to control the charge-pump unit (10) to perform a weak clamping mode if the sync tip is detected.

3. The clamping system as claimed in claim 2, where in the strong burst generating circuit comprises:
    a first comparator (61), which compares an offset signal (AFE_OFFSET) with the digital video signal output from the A/D converter (30);
    a first counter (62), which generate sampling time intervals;
    a first AND gate (63), which performs an AND logic operation on an output signal of the first comparator (61) and an inverted output signal of the operation control unit (50) at each sampling time interval;
    a second AND gate (64), which performs an AND logic operation on an inverted output signal of the first comparator (61) and the inverted output signal of the operation control unit (50) at each sampling time interval;
    a first up counter (65) connected to the first AND gate (63), wherein the first up counter (65) in response to the output data of the first AND gate (63) generates an output signal, wherein the output signal of the first up counter (65) is used as a strong up signal;
    a second up counter (66) connected to the second AND gate (64), wherein the first up counter (65) in response to the output data of the second AND gate (64) generates an output signal;
    an OR gate (67), which performs an OR logic operation on the output signals of the first and the second up counters (65,66); and
    a third AND gate (68), which performs an AND logic operation on an output signal of the OR gate (67) and a clock signal (CK_ADC) of the A/D converter to generate the strong burst signal.

4. The clamping system as claimed in claim 2, where in the weak burst generating circuit comprises:
    a second comparator (71) receiving the output signal of the A/D converter (30) and the offset signal (AFE_OFFSET), wherein based on the two received signals, the second comparator (71) outputs a weak up signal;
    a second counter (72), which sets a pulse width of the weak burst signal;
    an R-S flip flop (73), which generates a trig signal (CK_VCLAMP) based on a clamp signal and the output signal of the second counter (72); and
    a fourth AND gate (73), which receives the trig signal (CK_VCLAMP) and the clock signal (CK_ADC) of the A/D converter (30) to generate the weak burst signal.

5. The clamping system as claimed in claim 4, wherein the phase of the weak burst signal is optionally shifted in comparison to a negative edge of the sync tips signal by using a control register.

6. The clamping system as claimed in claim 2, wherein the first charge-pump circuit (11) is composed of a strong charge switch and a strong discharge switch coupled between an operating voltage and ground, wherein the second charge-pump circuit (12) is composed of a weak charge switch and a weak discharge switch coupled between the operating voltage and ground, wherein each switch is controlled to be conducting/non-conducting by the digital clamping controller (40).

7. The clamping system as claimed in claim 1, wherein the first charge-pump circuit (11) is composed of a strong charge switch and a strong discharge switch coupled between an operating voltage and ground, wherein the second charge-pump circuit (12) is composed of a weak charge switch and a weak discharge switch coupled between the operating voltage and ground, wherein each switch is controlled to be conducting/non-conducting by the digital clamping controller (40).

* * * * *